United States Patent [19]

Ishihara et al.

[11] Patent Number: 4,897,837
[45] Date of Patent: Jan. 30, 1990

[54] TEST CIRCUIT HAVING SELECTIVE BY PASS ARRANGEMENT FOR TEST DATA

[75] Inventors: Kazuya Ishihara; Shin-ichi Nakagawa, both of Hyogo, Japan

[73] Assignee: Mitsubishi Denki Kabushiki Kaisha, Tokyo, Japan

[21] Appl. No.: 182,867

[22] Filed: Apr. 13, 1988

[30] Foreign Application Priority Data

Apr. 14, 1987 [JP] Japan .................................. 62-92734

[51] Int. Cl.⁴ ............................................ G01R 31/28
[52] U.S. Cl. ..................................... 371/22.3; 371/27
[58] Field of Search ....................... 371/25, 27, 15, 24; 324/73 R, 73 AT

[56] References Cited

U.S. PATENT DOCUMENTS

| | | | |
|---|---|---|---|
| 4,317,200 | 2/1982 | Wakatsuki | 371/25 |
| 4,503,386 | 3/1985 | Dasgupta | 371/25 X |
| 4,513,418 | 11/1982 | Bardell, Jr. et al. | 371/25 |
| 4,519,078 | 5/1985 | Komonytsky | 371/27 X |
| 4,553,236 | 7/1984 | Zasio et al. | 371/15 |
| 4,597,042 | 9/1983 | d'Angeac et al. | 364/200 |
| 4,680,733 | 10/1984 | Duforestel et al. | 364/900 |
| 4,697,267 | 11/1985 | Wakai | 371/25 |
| 4,698,588 | 10/1987 | Hwang | 371/25 X |
| 4,701,921 | 10/1985 | Powell et al. | 371/25 |
| 4,701,922 | 8/1985 | Kuboki et al. | 371/25 |
| 4,710,931 | 10/1985 | Bellay et al. | 371/25 |
| 4,710,933 | 10/1985 | Powell et al. | 371/25 |
| 4,728,883 | 3/1988 | Green | 371/25 X |
| 4,764,926 | 8/1988 | Knight | 371/25 |
| 4,780,666 | 10/1988 | Sakashita | 371/25 X |

OTHER PUBLICATIONS

Glasser, Lance A. et al.:The Design and Analysis of VISI Circuits, Addison-Wesley Publishing Co., pp. 36-37.

Tusi, Frank F.: LSI/VLSI Testability Design, McGraw Hill Book Company, 1987, pp. 102-113.

Primary Examiner—Jerry Smith
Assistant Examiner—Robert W. Beausoliel
Attorney, Agent, or Firm—Lowe, Price, Leblanc, Becker & Shur

[57] ABSTRACT

The test pattern signal inputted from an input terminal is set at a corresponding circuit portion by shifting each shift register for prescribed times. Meanwhile, when a circuit portion of a certain circuit block only is to be tested, the test pattern signal from the input terminal is selected by a selected circuit and is directly applied to the shift register corresponding to that circuit block. Consequently, the test pattern signal is directly applied to the shift register corresponding to the circuit block without being passed through the shift registers on the way, so that the setting of the test pattern signal can be carried out quickly, enabling speedy testing.

4 Claims, 3 Drawing Sheets

TEST CIRCUIT HAVING SELECTIVE BY PASS ARRANGEMENT FOR TEST DATA

BACKGROUND OF THE INVENTION

1. Field of the Invention

The present invention relates to a test circuit and, more specifically, it relates to a test circuit incorporated in a substrate for testing each of the circuit portions constituting a circuit such as LSI.

2. Description of the Prior Art

Conventionally, in a device in which a plurality of circuits are fabricated on a substrate, such as LSI or VLSI, the test of each of the circuits has been carried out by incorporating a shift register on the same substrate. One example of such test circuit is disclosed in "LSI/VLSI Testability Design" by Frank F. Tsui, 1987, pp. 102-113.

FIG. 1 is a schematic block diagram showing one example of a conventional test circuit employing such a shift register as described in the foregoing. Referring to the figure, the test circuit is constituted by a plurality of shift registers 4a to 4h connected in series between an input terminal 1 and an output terminal 2, and the circuit tests each of the circuit portions 3a to 3f. Each of the circuit portions 3a to 3f is formed on the same semiconductor substrate, constituting a prescribed device as a whole. The shift registers 4a to 4h are formed on the same semiconductor substrate as the circuit portions 3a to 3f.

The operation of the conventional circuit shown in FIG. 1 will be hereinafter described. A test pattern signal is externally inputted to the input terminal 1 successively for carrying out test for each of the circuit portions 3a to 3f. On this occasion, each of the shift registers 4a to 4f is shifted for the necessary times, whereby the test pattern signal which is to be inputted to the circuit portion 3a is stored in the shift register 4a; the test pattern signal which is to be inputted to the circuit portion 3b is stored in the shift register 4b; the test pattern which is to be inputted to the circuit portion 3c is stored in the shift register 4c; the test pattern signal which is to be inputted to the circuit portion 3d is stored in the shift register 4d; the test pattern signal which is to be inputted to the circuit portion 3e is stored in the shift register 4e; and the test pattern signal which is to be inputted to the circuit portion 3f is stored in the shift register 4f, respectively. Thereafter, the test pattern signal stored in each of the shift registers 4a to 4f is inputted to each of the circuit portions 3a to 3f in parallel. Consequently, each of the circuit portions 3a to 3f carries out certain operation based on the inputted test pattern signal. The result of the operation of each of the circuit portions 3a to 3f is applied to one of the shift registers. More specifically, the result of operation of the circuit portion 3a is applied to the shift register 4d, the result of operation of the circuit portion 3b is applied to the shift register 4c, the result of operation of the circuit portion 3c is applied to the shift register 4f, the result of operation of the circuit portion 3d is applied to the shift register 4e, the result of operation of the circuit portion 3e is applied to the shift register 4h and the result of operation of the circuit portion 3f is applied to the shift register 4g, respectively, and these results are stored therein. By shifting each of the shift registers 4c to 4h for the necessary times, the result of operation of each of the circuit portions 3a to 3f is outputted from the output terminal 2. Whether each of the circuit portions 3a to 3f is properly operating or not can be tested by checking the result of operation of each of the circuit portions 3a to 3f obtained from the series of operation.

As described above, in a conventional test circuit, the shift registers are connected in series, so that even if the circuit portion which is distant from the input terminal 1 only is to be tested, the test pattern signal must be successively shifted through the shift registers on the way. For example, if the circuit portion 3e is to be tested, the test pattern signal is inputted to the shift register 4e after it passes through the shift registers 4a to 4d. Therefore, the number of shifting operation becomes large, and it takes much time for testing.

SUMMARY OF THE INVENTION

The present invention was made to solve the above described problem and its object is to provide a test circuit which is capable of reducing the test time compared with the conventional circuit.

Briefly stated, in a circuit having a plurality of shift registers connected in series between an input terminal for inputting test pattern signals and an output terminal for outputting the signal of the result of operation of each of the circuit portions, wherein the test pattern signals are shifted by these shift registers to apply corresponding test pattern to each of the circuit portion and the result of operation of each of the circuit portions is taken into the shift register and is shifted to the direction of the output terminal, the present invention further provides a bypass circuit for applying a test pattern signal from the input terminal directly to the prescribed shift register not through the shift registers on the way.

According to the present invention, when a certain circuit portion is to be tested, the test pattern signal can be directly inputted from the input terminal to the shift register corresponding to that circuit portion, so that the number of shifting operation can be reduced compared with the conventional one, enabling reduction of test time.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
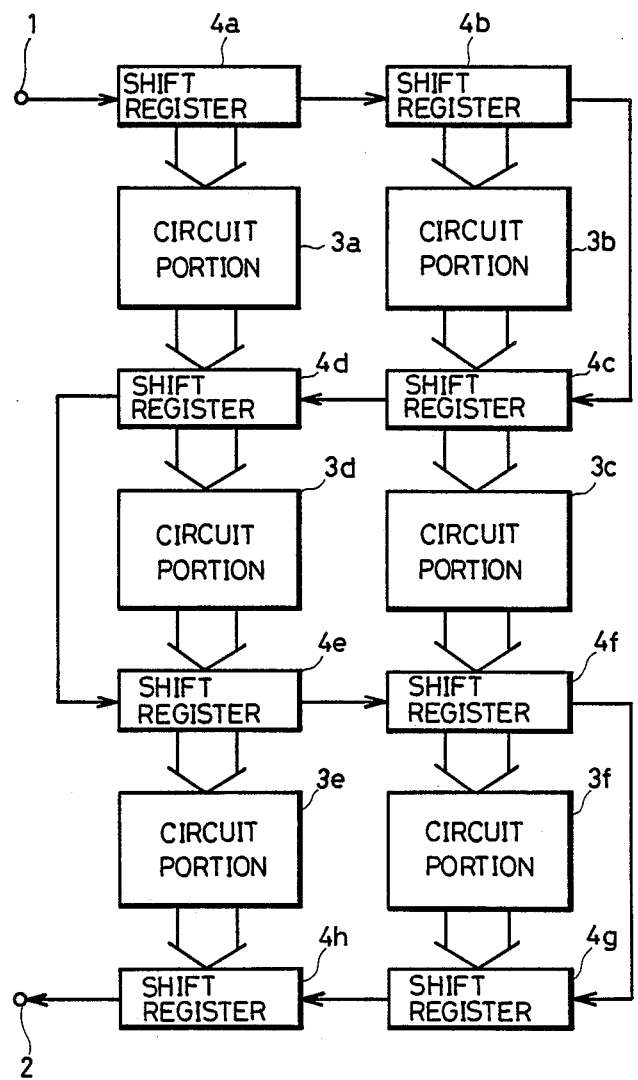
FIG. 1 is a schematic block diagram showing one example of a conventional test circuit.
Figure 2:
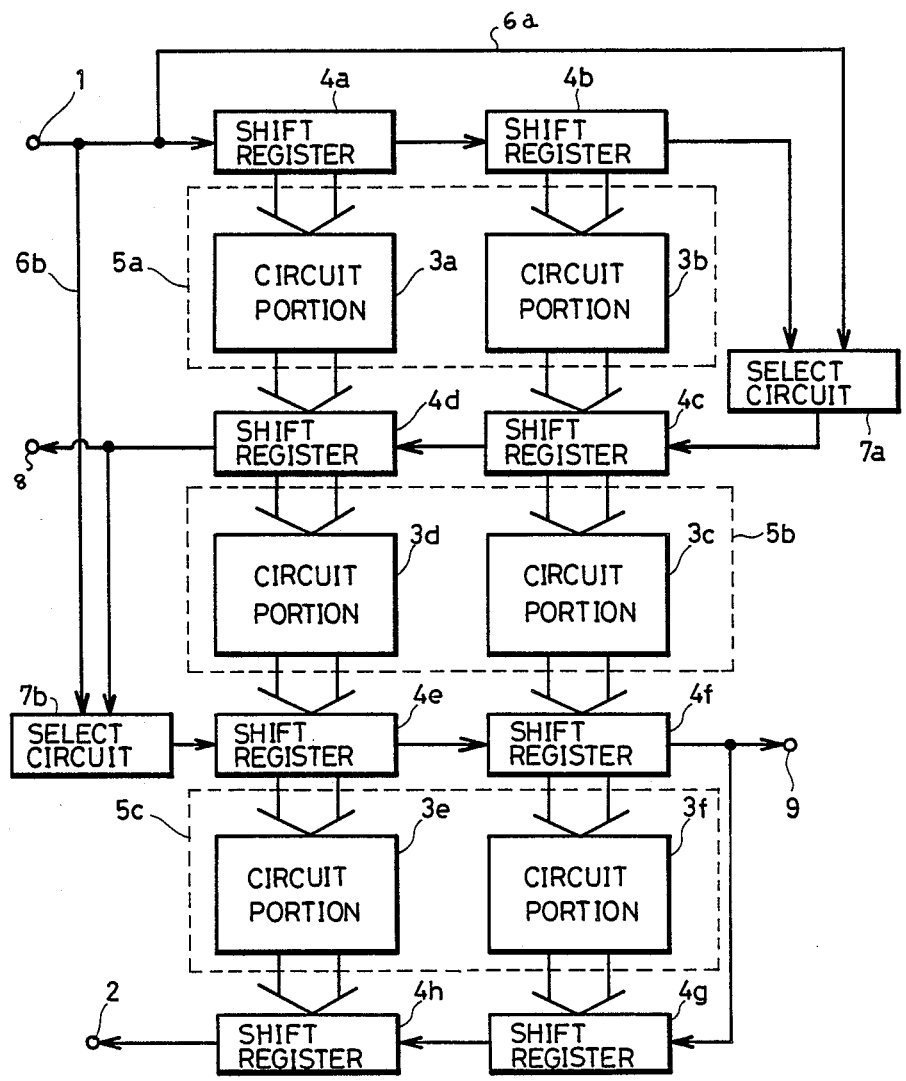
FIG. 2 is a schematic block diagram showing a test circuit of one embodiment of the present invention.

The structure of one embodiment of the present invention will be described with reference to FIG. 2. Meanwhile, the embodiment shown in FIG. 2 is similar to the structure of the embodiment shown in FIG. 1 except the following points, and the corresponding portions are denoted by the same reference numerals with the description thereof being appropriately omitted. In the embodiment shown in FIG. 2, the circuit portions 3a to 3f are divided into groups of plurality of circuit blocks. Namely, the circuit portions 3a and 3b belong to the circuit block 5a, circuit portions 3c and 3d belong to the circuit block 5b and the circuit portions 3e and 3f belong to the circuit block 5c. Except for the circuit block 5a in the first stage, the circuit blocks 5b and 5c are provided with select circuits 7a and 7b, respectively. The select circuit 7a is the circuit which selects either the output of the shift register 4b or the input from the input terminal 1 inputted through the signal line 6a to apply the same to the shift register 4c. The select circuit 7b is the circuit which selects either the output of the shift register 4d or the input signal from the input terminal 1 applied through the signal line 6b to apply the same to the shift register 4e. In addition, output terminals 8 and 9 are provided for directly guiding respective outputs of the shift registers 4d and 4f to the outside. Each of the circuit described in the foregoing is formed on the same semiconductor substrate or on the same printed circuit board.

The operation of the embodiment shown in FIG. 2 will be hereinafter described. When neither the signal from the signal line 6a nor the signal from the line 6b is selected in the select circuits 7a and 7b, the operation is the same as that of the conventional circuit shown in FIG. 1.

When the signal from the signal line 6a or 6b is selected in the select circuit 7a or 7b, the operation is peculiar to the present embodiment. Description will be made of a case in which the circuit portions 3c and 3d included in the circuit block 5b are tested, for example. In this case, the input signal from the signal line 6a is selected in the select circuit 7a. Therefore, the test pattern signal inputted in the input terminal 1 is directly applied to the shift register 4c without being passed through the shift registers 4a and 4b. Therefore, the setting of the test pattern signal to the circuit portions 3c and 3d can be carried out by shifting the shift registers 4c and 4d for the prescribed times. The results of operation of the circuit portions 3c and 3b are respectively applied in parallel to the shift registers 4f and 4e and stored therein. The results of operation stored in the shift registers 4f and 4e are successively shifted by the shifting operation, and guided to the outside from the output terminal 9 or from output terminal 2 through the shift registers 4g and 4h. By checking the results of operation by the circuit block 5b obtained from the series of the operation, whether the circuit portions 3c and 3d operate properly or not can be tested.

When the circuit portions 3e and 3f included in the circuit block 5c are to be tested, the signal from the signal line 6b is selected in the select circuit 7b. Therefore, the test pattern signal inputted from the input terminal 1 is directly applied to the shift register 4e without being passed through the shift registers 4a to 4d. Consequently, the test pattern signal can be set in the circuit portions 3e and 3f only by the shifting operation of the shift registers 4e and 4f. Each result of operation of the circuit portions 3e and 3f is applied to each of the shift registers 4h and 4g, shifted and guided to the outside from the output terminal 2.

When only the circuit portions 3a and 3b included in the circuit block 5a are to be tested, the test pattern signal is inputted, the shifting operation is finished when the corresponding test pattern signals are stored in the shift registers 4a and 4b, and the said test pattern signals are set in parallel in each of the circuit portions 3a and 3b in the conventional manner. The results of operation of the circuit portions 3a and 3b are respectively applied to the shift registers 4d and 4c and shifted and guided outside from the output terminal 8.

As described above, according to the embodiment shown in FIG. 2, when a certain circuit block is to be tested, the test pattern signal from the input terminal 1 can be directly inputted to the corresponding shift register without being passed through the shift registers corresponding to the circuit blocks on the way so that the number of shifting operation can be reduced and the test time can be reduced.

Although each of the circuit blocks 5a to 5c respectively comprises two circuit portions in the above described embodiment, the present invention is not limited to that structure and the number of the circuit portions included in each of the circuit block can be arbitrarily selected. In addition, by providing a select circuit for each circuit portion without dividing the circuit portions into blocks, the test pattern signal can be directly inputted to each circuit portion without being passe through any extra shift register.

If the same test pattern signal is to be inputted to each of the circuit blocks 5a to 5c in the above described embodiment, the test pattern signal can be simultaneously inputted to the shift registers in each of the circuit blocks 5a to 5c from the input terminal 1 by simultaneously selecting the input signal from the signal line 6a in the select circuit 7a and the signal from the signal line 6b in the select circuit 7b, whereby the test time can be still more reduced.

Figure 3:
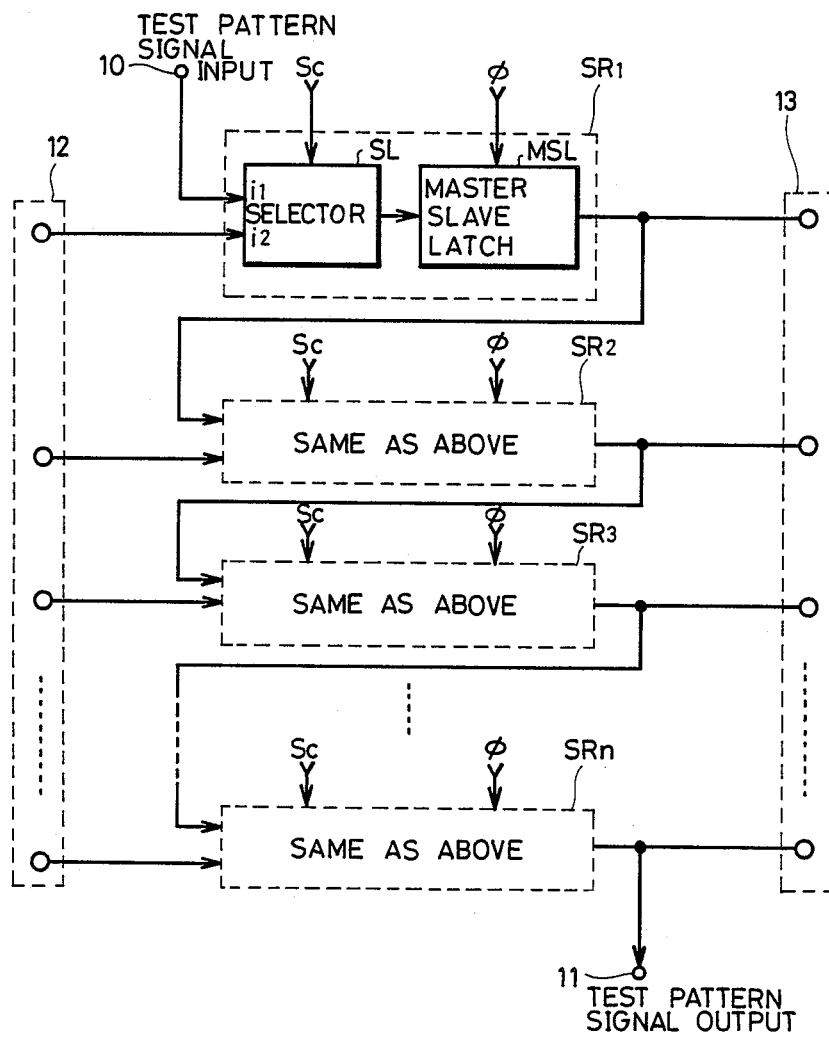
FIG. 3 is a block diagram showing one example of the structure of the shift register shown in FIG. 2.

Meanwhile, the shift registers employed in the embodiment shown in FIG. 2 has the function of latching the parallel results of operation applied from each of the circuit portions as well as the function of serially shifting the inputted test pattern signals. Therefore, one example of the circuit structure of each shift register will be shown in FIG. 3 as a reference. In FIG. 3, the shift register of the present embodiment is constituted by a plurality of scan registers SR1, SR2, ... SRn connected in series between the test pattern signal input terminal 10 and the test pattern signal output terminal 11. The slave registers SR1 to SRn of the same number as the bit number of the test pattern signal employed for one circuit portion are prepared. Each of the slave registers SR1 to SRn comprises a selector SL and a master slave latch MSL. Now, each selector SL selects the data inputted to the input terminal i1 when the switching signal Sc is "H", and it selects the data inputted to the input terminal i2 when the switching signal Sc is "L". The results of operation from corresponding circuit portions are applied in parallel to the input terminal i2 of each selector SL through the input terminal group 12. Meanwhile, each master slave latch MSL takes in the input data from the corresponding selector SL when the clock signal $\phi$ is "H" and holds the said input data when the clock signal $\phi$ is "L". The output of each master slave latch MSL is applied to the slave register of the succeeding stage and, at the same time, the output is taken out in parallel to be applied to the corresponding circuit portion from the output terminal group 13.

In the above described structure, since each selector SL selects the input signal at the input terminal i1, that is, the output data of the slave register of the high order bit when the switching signal Sc is "H", n master slave latches MSL which are in synchronization with the clock signal $\phi$ are connected in series, so that the shift register shown in FIG. 3 operates to serially shift the test pattern signal. Namely, in this case, each shift register operates in the serial mode.

Meanwhile, when the switching signal Sc is "L", each selector SL selects the parallel data from the input terminal group 12 and the data is taken in each master slave latch MSL by the clock signal φ. The data held by each master slave latch MSL is outputted in parallel from the output terminal group 13. Namely, on this occasion, the shift register operates in the parallel mode, in which the test pattern signals are set in parallel in the corresponding circuit portions or the results of operation from the corresponding circuit portions are taken in parallel.

The structure of the shift register shown in FIG. 3 is only an example and other circuit structures may be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test circuit formed on a substrate for testing each of a plurality of circuit portions constituting a device fabricated on said substrate, comprising:
   an input terminal for inputting a test pattern signal;
   an output terminal for outputting a signal of the result of operation of said circuit portion; and
   a plurality of shift registers connected in series between said input terminal and said output terminal for successively shifting and holding said test pattern signal; wherein
   each of said shift registers applies corresponding test pattern signal to each of said circuit portions by shifting said inputted test pattern signal and takes in and shifts the result of operation from each circuit portion; said test circuit further comprising
   bypass circuit means for applying said test pattern signal from said input terminal directly to a selected shift register of said plurality of shift registers.

2. A test circuit according to claim 1, wherein
   each of said circuit portions is divided into groups of plural circuit blocks with each circuit block comprising at least one circuit portion, and wherein
   said bypass circuit means is provided for each of said circuit blocks.

3. A test circuit according to claim 1, wherein said bypass circuit means comprises a selection circuit for selecting an output signal from the shift register in a preceding stage thereof and the test pattern signal from said input terminal.

4. In a circuit arrangement having a plurality of circuit portions and a shift register having a plurality of shift register stages connected to both the inputs and outputs of said circuit portions,
   wherein test data is supplied from and input terminal of said circuit arrangement by said shift register to respective ones of said circuit portions and responses of said circuit portions to said test data are output through a portion of said shift register, the improvement comprising
   bypass circuit means for bypassing selected portions comprising one or more of said shift register stages of said shift register, said bypass circuit means including select means for selecting, as an input to a shift register stage, test data appearing at another point in said circuit arrangement including test data applied to said input terminal of said circuit arrangement and test data appearing at the output of a preceding shift register stage of said shift register.

* * * * *